(12) United States Patent
Wilber

(10) Patent No.: US 6,233,020 B1
(45) Date of Patent: May 15, 2001

(54) PHASE LOCK LOOP WITH SELECTABLE RESPONSE

(75) Inventor: James Albert Wilber, Indianapolis, IN (US)

(73) Assignee: Thomson Licensing S.A.

(*) Notice: Subject to any disclaimer, the term of this patent is extended or adjusted under 35 U.S.C. 154(b) by 0 days.

(21) Appl. No.: 09/130,977

(22) Filed: Aug. 7, 1998

(51) Int. Cl.[7] .................................................. H03L 7/00
(52) U.S. Cl. ............................................ 348/543; 348/542
(58) Field of Search .................................. 348/530, 531, 348/543, 555, 544, 542; 331/4, 20

(56) References Cited

U.S. PATENT DOCUMENTS

| | | | |
|---|---|---|---|
| 4,048,655 | * 9/1977 | Hofmann | 348/521 |
| 5,541,556 | * 7/1996 | Francis | 348/521 |

* cited by examiner

Primary Examiner—Victor R. Kostak
(74) Attorney, Agent, or Firm—Joseph S. Tripoli; Harvey D. Fried; Francis A. Davenport

(57) ABSTRACT

A video display apparatus for pictures from broadcast sources having standard or high definition, which may also display computer generated images. To display this range of sources a horizontal frequency signal generator is selectably operable at a plurality of frequencies. The generator comprises an oscillator controlled for synchronized oscillation at a plurality of horizontal frequencies. A source of synchronizing pulses is coupled to an input of a phase detector which has another input coupled to the oscillator. The phase detector generates an output signal representative of a phase difference between the inputs. A processor is coupled to the phase detector for processing the output signal and generating a control signal for controlling the oscillator. The processor gain is controlled responsive to selected ones of the plurality of frequencies.

20 Claims, 2 Drawing Sheets

PHASE LOCK LOOP WITH SELECTABLE RESPONSE

This invention relates generally to the field of horizontal scanning systems for video display apparatus and in particular to the synchronization and generation of horizontal rate signals in systems operable at multiple horizontal scanning frequencies.

BACKGROUND

In a video display apparatus, scanning circuits are synchronized to a synchronizing component or sync derived from the input video signal. Hence, a video display apparatus which is operable at multiple horizontal scanning frequencies must be capable of synchronizing to a standard definition NTSC signal horizontal scanning frequency of nominally 15.734 kHz or to a high definition, Advanced Television Standards Committee, ATSC, signal having horizontal scanning frequency of nominally 33,670 kHz with 1080 active lines and interlaced scanning (1080I ). In addition to synchronizing to broadcast video signals, the apparatus may be required to display computer generated non-broadcast video signals, such as, for example, a super video graphics adapter signal or SVGA, having a horizontal frequency of 37,880 kHz.

Horizontal frequency oscillators employing phase locked loop control are widely known and used in video display apparatus. Dual and triple phase locked loops are also known and used to provide functional separation between potentially conflicting requirements of synchronization and scanning waveform generation. In a dual loop configuration, a first loop may be a conventional phase locked loop in which a voltage controlled oscillator output, or an output divided therefrom is compared with horizontal synchronizing pulses derived from the video signal to be displayed. The second phase locked loop, which for example, operates at the same frequency, compares the oscillator output from the first loop with a horizontal rate pulse, for example, a retrace pulse voltage derived from or representative of deflection current flow. The error voltage from the second phase comparison is used to generate a width modulated pulse signal which determines the initiation of the deflection output device turn off, and subsequently, retrace initiation, or the phase of each line within the period of a vertical scan.

The response of the first phase locked loop may be optimized for fringe area reception of broadcast video signals suffering poor signal to noise ratios. Such signals suggest that the response of the first phase locked loop is relatively slow. Accordingly, the first loop may have a narrow bandwidth to optimize phase jitter reduction. However, since a video display apparatus is required to be operable with signals from a variety sources and with differing horizontal frequencies. The response of the first phase locked loop represents a compromise between a narrow bandwidth for minimized phase jitter and a wide bandwidth, fast loop response capable of rapid phase recovery. For example, a narrow bandwidth loop is suited to synchronization by low noise, non-broadcast computer generated signals, whereas and wide bandwidth, fast loop response, capable of rapid phase recovery is required for synchronization of video cassette recorder (VCR) replay signals where abrupt changes in horizontal sync. pulse phase, by as much as 10 microseconds may occurring between the beginning and end of the vertical banking interval. Hence tradeoffs in respective loop responses may be made to provide adequate weak signal performance without significant overall degradation of receiver performance. The second phase locked loop generally has a faster loop response. Accordingly, the second phase locked loop may have a wider bandwidth allowing it to track variations in the deflection current due to horizontal output transistor storage time variations, or high voltage transformer tuning effects. Such tight tracking yields a straight, non-bending raster largely independent of beam current loading.

The use of voltage controlled oscillators for horizontal frequency signal generation is well known. It is known to employ an oscillator operating at a multiple of the input horizontal sync. frequency and to achieve synchronization by means of a down counter with a selectable divide by two stage. However, when input signals have non-integer horizontal scanning frequencies, simple halving or doubling of an oscillator count down ratio cannot readily provide synchronization. In addition, input signals that are subject to widely differing distortions necessitate differing processing characteristics to provide optimized display performance.

SUMMARY OF THE INVENTION

The conflicting requirements of horizontal oscillator synchronization with multiple frequencies and sync signals from differing sources are advantageously resolved by an inventive arrangement. A horizontal frequency signal generator is selectably operable at a plurality of frequencies. The generator comprises an oscillator controlled for synchronized oscillation at a plurality of horizontal frequencies. A source of synchronizing pulses is coupled to an input of a phase detector which has another input coupled to the oscillator. The phase detector generates an output signal representative of a phase difference between the inputs. A processor is coupled to the phase detector for processing the output signal and generating a control signal for controlling the oscillator. The processor gain is controlled responsive to selected ones of the plurality of frequencies. In a further inventive arrangement a synchronizing circuit comprises a voltage controlled oscillator generating a horizontal frequency signal at a plurality of frequencies. A synchronizing means synchronizes the voltage controlled oscillator to a source of horizontal synchronizing pulses. An active low pass filter is coupled to the synchronizing means for filtering a voltage from the synchronizing means for coupling to synchronize the voltage controlled oscillator. The active filter bandwidth is changed responsive to operation at one of the plurality of frequencies.

DETAILED DESCRIPTION

Figure 1:
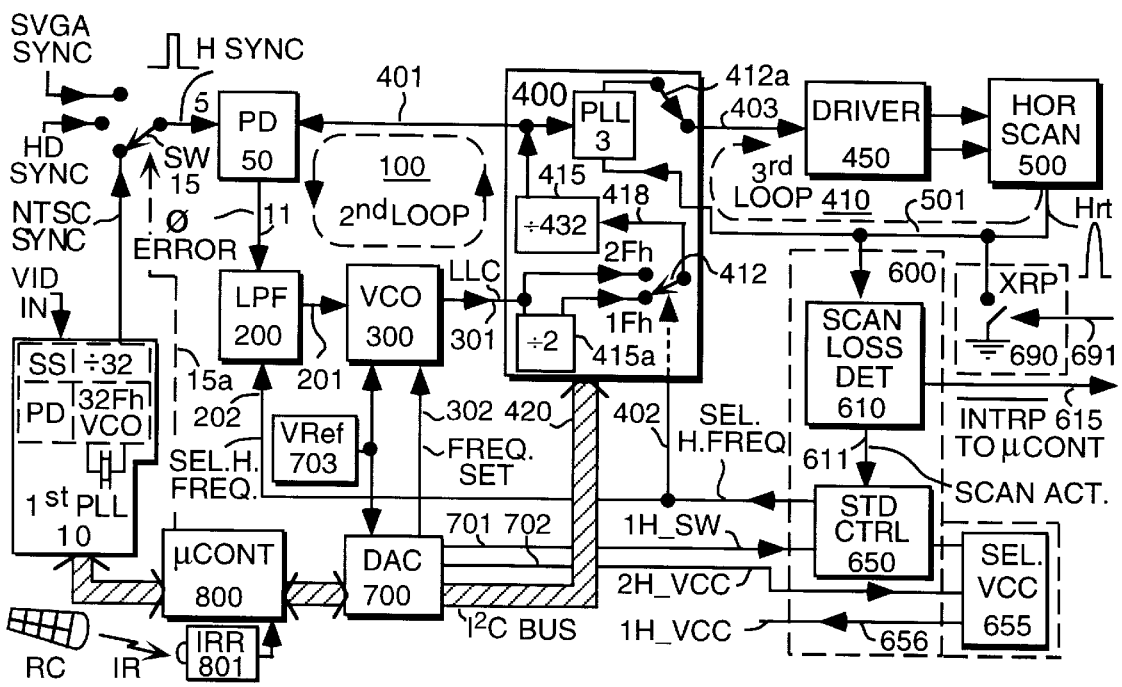
FIG. 1 is a block diagram of an exemplary horizontal frequency oscillator employing three phase locked loops with various inventive arrangements.

A horizontal frequency oscillator and deflection amplifier employing three phase locked loops and operable at a plurality of frequencies is shown in FIG. 1. In a first phase locked loop 10, an input video display signal, for example a standard definition NTSC signal is coupled to a sync separator, SS, where a horizontal synchronizing signal component is separated. A voltage controlled oscillator has a frequency of 32 times an NTSC horizontal frequency, 1Fh, and is divided by 32 in a counter, depicted as, ÷32. The divided oscillator signal is coupled as one input to a phase detector PD, with the second input coupled to the separated sync component. The resulting phase error between the divided oscillator signal and the separated syncs is coupled from phase detector, PD, to synchronize the 32Fh voltage controlled oscillator. The functional elements of PLL 10, form part of a bus controlled integrated circuit, for example type TA1276. The standard definition horizontal sync component from PLL10 is coupled to a sync source selector switch SW15 which provides selection between a plurality of synchronizing signals coupled as input sources to synchronize second and third controlled horizontal oscillator loops, 100 and 410 respectively. Selector switch SW15 is depicted with three exemplary sync sources, namely a standard definition NTSC sync signal, a high definition sync signal, for example ATSC 1080I, and a computer generated SVGA sync signal, however, sync selection for horizontal oscillator synchronization signal is not limited to these examples. Sync switch SW15 is controlled by switching signal 15a which is generated by microcontroller 800 in response to a user control command, for example, as generated by a remote control transmitter RC, which communicates by wireless means IR to receiver IRR, 801 which inputs the remote control data to microcontroller 800. Remote control RC allows display signal source selection, for example, changing broadcast TV channels between HD and SD broadcasts or viewing a computer program with selectable display resolution.

The three phase locked oscillators depicted in FIG. 1 are advantageously controlled to provide optimized performance, not only with input signals of differing frequencies but also with signals subject to timing perturbations. During the display of NTSC signals, loops 10, 100 and 410 are utilized. However NTSC signals may originate from a broadcast source or a VCR. The latter source may be subject to sync phase perturbations, thus such signal disturbances are advantageous accommodated within PLL 100 by means of controlled selection of low pass filter characteristic. Selection of high definition signal inputs, for example ATSC or SVGA cause PLL10 to be bypassed reducing the sync system to two controlled loops, for example PLL100 and PLL410. Thus microcontroller 800 is required to control input video display selection responsive to user commands, to control sync source selection responsive to the display selection, control the oscillator frequency, the oscillator divider and phase locked oscillator low pass filter characteristics.

The selected synchronizing signal 5, from switch 15, is coupled to an input of phase detector 50 to facilitate synchronization of the second phase locked loop 100. A second input to phase detector 50 is supplied with signal 401, derived by division of voltage controlled oscillator signal 301. The resulting phase error signal 11 is low pass filtered and applied to control VCO 300 thus achieving synchronism with the input video display signal horizontal sync. The third phase locked loop 410 compares a signal from voltage controlled oscillator VCO 300 with a scanning related signal Hrt, for example a horizontal scan derived pulse resulting from a scanning current generated by a scanning amplifier 500.

The center frequency of horizontal oscillator 300 is determined by means of control bus 420, for example an $I^2C$ bus, which advantageously transmits data words which independently change the oscillator frequency and the low pass filter characteristics. In addition an advantageous protection circuit 600 prevents circuitry damage resulting from accidental, erroneous and undesired switching of divide by two counter 415A by means of an electronic interlock.

Operation of the second and third horizontal oscillator loops and scanning amplifier of FIG. 1 is as follows. A horizontal sync signal 5, depicted as an exemplary positive pulse, is selected by switch 15 from either PLL10 or sync signals derived from a plurality of input display signals. Synchronizing signal 5 is applied to a phase detector 50 where it is compared with a horizontal rate signal 401 produced by division of line locked clock signal LLC, 301 from voltage controlled oscillator, VCO 300. Block 400 represents an exemplary deflection processing integrated circuit IC 400, for example type TDA9151. Integrated circuit 400 is bus controlled, for example by $I^2C$ bus 420, and also includes a phase detector PLL3, and dividers 415 and 415A. Divider 415A is controlled by signal 402, to provide division ratios of 432 and 864 respectively and thereby produce horizontal rate signals in two bands of frequencies, nominally 1Fh and 2Fh. Control signal 402 is coupled to switch 412 which inserts or bypasses divider 415A, to provide two division ratios. Thus voltage controlled oscillator, VCO 300 operates only in a band of frequencies about 13.6 MHz, but is synchronized to horizontal frequencies differing by more than 2:1.

Examples of such non-integer related horizontal frequencies are NTSC signals where the horizontal frequency, represented by 1Fh, is 15.734 kHz and an ATSC 1080I signal with a horizontal frequency, represented relative to the NTSC signal as 2.14Fh, or 33.670 kHz. During the display of NTSC derived images, switch 412 selects divider 415A which provides a division ratio of 864:1 yielding a frequency nominally that of the NTSC horizontal frequency 1Fh. Similarly for the display of images with horizontal frequencies of 2Fh or greater, for example an ATSC 1080I signal, switch 412 bypasses divider 415A resulting in a division ratio of 432 which produces a horizontal frequency 2Fh, of 31.468 kHz, twice that of the NTSC standard. However, the ATSC 1080I horizontal frequency is not an integer multiple of the NTSC signal 1Fh and is actually 2.14 times the NTSC frequency. Thus to achieve synchronism with a 1080I input signal, or any non 2Fh sync rate, requires that the VCO frequency is changed to a frequency which when divided by 432 yields a frequency which may be synchronized with that of ATSC 1080I, or the selected input signal horizontal rate.

Divided line locked clock signal 401 is also coupled to synchronize the third loop 410 by means of phase detector PLL3, which compares clock signal 401 with a scan current derived pulse Hrt, 501. An output signal 403 from PLL3 is coupled via a driver stage 450 to a horizontal scanning stage 500 which generates a scan related current, for example, in a display device or an electron beam deflection coil. In addition to coupling to PLL3, scanning pulse Hrt is also coupled to protection circuit 600 and X-ray protection circuit 690.

Figure 4:
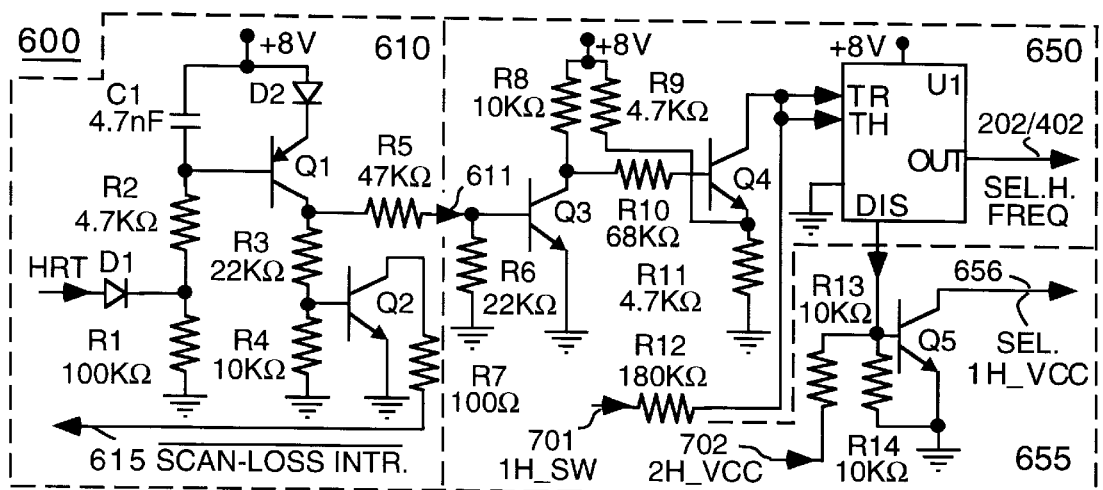
FIG. 4 is a schematic diagram of the inventive switching interlock which forms of part of FIG. 1.

A protection circuit 600, is shown in FIG. 4, which provides various protective functions related to the presence or absence of scanning current as indicated by detection of pulse Hrt, 501. Circuit block 610, detects the presence or absence of pulse 501 and generates an active low interrupt, SCAN-LOSS INTR. 615, which is coupled to a microcontroller, μ CONT. 800.

A second protective function provided by circuit 600 is to inhibit horizontal frequency selection during the presence of pulse 501, i.e. during scanning. Horizontal frequency selection data is coupled from microcontroller 800 by bus 420. Data from the bus is demultiplexed and frequency selection data is digital to analog converted by DAC 700 to form switching signal 1H_SW for coupling to circuit block 650. The circuitry of block 650 allows the logical state of signal 1H_SW to be coupled for frequency selection only if scan amplifier 500 is not generating pulses Hrt. Thus any change of horizontal frequency is inhibited or interlocked until the cessation of scan related pulses.

In block 610 of FIG. 4, scan derived pulses Hrt are rectified by diode D1 and charge capacitor C1 positively via a resistor R2 towards the positive supply. The junction of resistor R2 and capacitor C1 are joined to the base of a PNP transistor Q1 with the result that the positive charge developed across capacitor C1 turns the transistor off when deflection related pulses are present. The emitter of transistor Q1 is coupled to a positive voltage supply via a diode D2 which prevents base emitter zenner breakdown and ensures that transistor Q1 turns off when the pulse derived charge across capacitor C1 is approximately 1.4 volts or less. The collector of transistor Q1 is coupled to ground via series connected resistors R3 and R4. The junction of the resistors is coupled to the base of an NPN transistor Q2 which has the emitter grounded and the collector coupled via a resistor R7 to form an open collector output signal. Thus when pulses Hrt are present transistor Q1 is turned off, which in turn turns off transistor Q2 rendering output signal 615, scan loss interrupt, an open circuit. When scan related pulses are absent, for example as a consequence of a bus derived control function, circuit failure or X-ray protection, the positive charge developed across capacitor C1 is dissipated via the series combination of resistors R1 and R2 thus allowing capacitor C1 to charge towards ground potential. When the potential across capacitor C1 is nominally 1.4 volts transistor Q1 turns on with the collector terminal assuming the nominal potential at the cathode of diode D2. Thus this positive potential of about 7 volts at transistor Q1 collector is applied via the potential divider formed by resistors R3 and R4 to the base of transistor Q2, which turns on taking the collector and output signal 615 to nominal ground potential. Signal 615 is an interrupt signal which, when low, signals microcontroller 800 that scanning current is absent in the exemplary display or coil.

The collector of transistor Q1 of FIG. 4, is also coupled to circuit block 650 which advantageously allows or inhibits changes of horizontal frequency originated by the microcontroller and communicated via bus 420 to a digital to analog converter DAC 700. The digital to analog converter 700 generates an analog control signal 1H_SW which has two voltage values. When control signal 1H_SW is nominally at zero volts (Vcesat), divide by two stage of processor 400 is bypassed and divider 415 divides the VCO output signal LLC, 301, by 432 to produce a frequency in a higher band of horizontal frequencies equal to or greater than 2Fh. When control signal 1H_SW is approximately 9.6 volts, divide by two stage 415A is selected which produces a combined division of 864. Thus the VCO generated line locked clock LLC 301 is divided by 864 to produce a nominal frequency of 1Fh. The collector of transistor Q1 is coupled via series connected resistors R5 and R6 which form a potential divider to ground. The junction of resistors R5 and R6 is coupled to the base of an NPN transistor Q3 which has a grounded emitter. The collector of transistor Q3 is connected to the positive supply via a load resistor R8 and is also coupled to the base of an NPN transistor Q4 via a resistor R10. The emitter of transistor Q4 is coupled to the junction of a potential divider formed between the positive supply and ground where resistor R9 is connected to the supply and resistor R11 is connected to ground. Thus, the emitter of transistor Q4 is biased at about 4 volts. Hence transistor Q4 is turned on when the base voltage exceeds about 4.7 volts causing the collector to assume the nominal emitter potential. The collector of transistor Q4 is connected directly to the junction of control signal 1H_SW, and both the trigger input TR and threshold the threshold input of input TH of integrated circuit U1, for example I.C. type LMC 555. Thus with both the trigger and threshold inputs clamped to 4 volts, changes in control signal 1H_SW resulting from bus generated commands or erroneous signal pickup are prevented from changing the output state of I.C. U1. The threshold input of integrated circuit U1 responds when voltage value of control signal 1H_SW exceeds about 5.3 volts and results in the selection of a 1Fh scanning frequency. The trigger input of I.C. U1 responds to a negative transition of control signal 1H_SW and when the voltage value is less than approximately 2.6 volts results in the selection of a 2Fh scanning frequency.

Operation of circuit 650 is as follows. The presence of Hrt pulses coupled to circuit 610 turns off transistor Q1 with the collector assuming a nominally ground potential via the parallel combination of series connected resistors R3 and R4, and series connected resistors R5 and R6. Thus, transistor Q3 is also turned off with the collector assuming the nominal supply voltage via resistor R8. This positive potential is applied to the base of transistor Q4 which turns on connecting the junction of control signal 1H_SW and integrated circuit U1 to a potential of about +4 volts. With +4 volts applied to both the trigger and threshold inputs of IC U1, U1 is prevented from responding to changes of control signal 1H_SW. Thus the current status of select horizontal frequency control signal 202/402 is maintained and cannot be changed whilst scanning pulses Hrt are present. Hence any change of horizontal frequency is prevented and failure of horizontal scanning stage 500 is prevented.

In the absence of scanning pulses transistor Q1 turns on and the collector assumes the nominal supply potential. This positive potential is coupled via series resistors R5 and R6 and turns on transistor Q3 which in turn, turns off transistor Q4. With transistor Q4 off, the inhibit is removed from integrated circuit U1, thus for 1Fh operation signal 1H_SW assumes a high voltage value, and IC U1 output SEL. H. FREQ., assumes a low voltage value. Similarly when 2Fh operation is selected control signal 1H_SW assumes a low voltage with U1 output SEL. H. FREQ., assuming a high voltage value. T The advantageous control of integrated circuit U1 by means of pulse Hrt presence or absence is also utilized in circuit block 655 of FIGS. 1 and 4. In FIG. 4, a power supply switching command 2H_VCC, from DAC 700, is coupled to series connected resistors R13 and R14 which form a potential divider to ground. The junction of the resistors is connected to the base of a transistor Q5 which has the emitter grounded and the collector connected as an open collector output to generate power supply control signal SEL. 1H_VCC, 656. The base of a transistor Q5 is also connected to a discharge output of I.C. U1. The operation of circuit block 655 is as follows. A power supply switching command is generated by microcontroller 800 and transmitted by bus 420 to DAC 700 for demultiplexing and generation of control signal 2H_VCC, 702. When control signal 702 is high, for example, approximately +9.6 volts, transistor Q5 is turned on and the collector, and output control signal SEL. 1H_VCC, 656 assume a potential of nominally zero volts, (Vcesat) of transistor Q5. However, operation of transistor Q5 is controlled by the discharge output circuitry of IC U1 which prevents transistor Q5 from inverting power supply control signal 2H_VCC by clamping the base to nominal ground potential, Vcesat, of the discharge transistor of IC U1. Thus power supply switching is prevented and signal SEL. 1H_VCC, 656 remains high, sustaining a 1Fh power supply condition, for example a lower operating voltage. The discharge circuitry of I.C. U1 becomes inactive when the output circuitry of U1 changes state, i.e. output signal SEL H. Freq. goes low in response to the selection of a 2Fh operating mode. Thus power supply selection for 2Fh and higher horizontal frequencies requires that a 2Fh scanning frequency is initially selected whilst scanning is inactive.

As has been described, the operating frequency of the second and third phase locked loops may be changed in the ratio of 2:1 by means of switching divider 415a. However, to achieve synchronization of the VCO at other than harmonically related frequencies, for example with an ATSC 1080I frequency of 2.14Fh, or an SVGA signal with an 2.4Fh horizontal frequency, requires that the VCO of second phase locked loop is controlled to achieve a nominal horizontal frequency of between 2.14 and 2.4 times that of an NTSC horizontal frequency. In voltage controlled oscillator 300 an advantageous frequency setting DC potential, FREQ. SET, 302 determines an oscillator frequency which when divided generates a nominal horizontal frequency. The frequency setting DC potential is generated by a digital to analog converter and is applied to a voltage variable capacitor or varicap diode which forms part of the oscillator frequency determining network. The oscillator is synchronized to the input sync signal by means of a phase detector error signal, which is filtered and applied to an inductor which is part of the frequency determining network of VCO 300. In simple terms, a frequency setting DC is applied to the varicap diode end of the series tuned network, with the phase error signal applied at the inductor end. Thus frequency and phase control signals are applied across the frequency determining tuned circuit.

Figure 3:
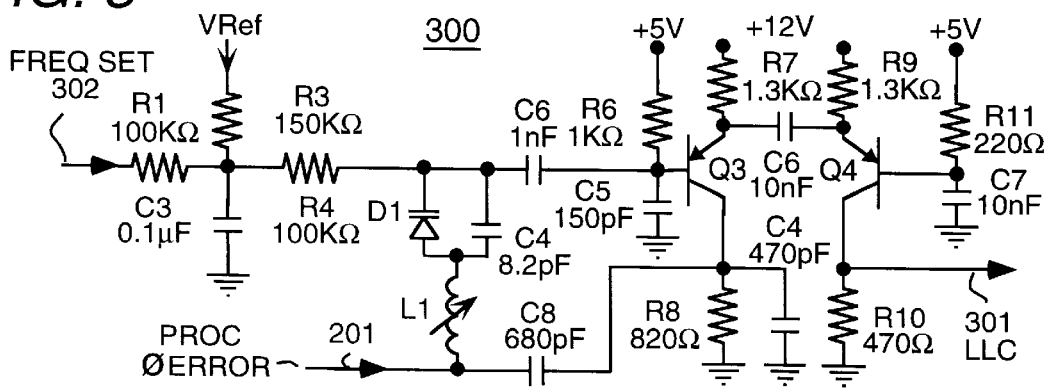
FIG. 3 shows a voltage controlled oscillator including inventive features which form part of FIG. 1.

Voltage controlled oscillator 300 is depicted in FIG. 1 and is shown in schematic form in FIG. 3. Operation of the advantageously controlled oscillator 300 is as follows. Microcontroller 800 and a memory, (not shown), access and output frequency setting data via data bus 420, for example an I²C bus, as illustrated in FIG. 1. The I²C bus is connected to a digital sync processor 400, to provide various control functions, and to a digital to analog converter 700 which separates and converts data into analog voltages. Digital to analog converter 700 generates frequency switching control signal 1H_SW, 701, and VCO frequency setting voltage FREQ. SET 302. In FIG. 3, the frequency setting voltage FREQ. SET 302 is coupled via a resistor R1 to the junction of resistors R3, R4 and a capacitor C3, which in conjunction with resistor R1 forms a low pass filter to ground. Resistors R1 and R3 form a potential divider for the frequency setting voltage with resistor R3 connected to DAC 700 reference voltage (VRef). Thus analog voltage 302 is nominally halved and referenced to the DAC reference voltage (Vref) to apply a nominal voltage of about +3.8 volts of biasing potential to varicap diode D1. The junction of resistors R1, R3 and capacitor C3 are coupled to the cathode of varicap diode D1 via a resistor R4. Thus the nominal DC voltage value, derived from voltage (Vref), plus a data determined frequency setting voltage 302, from ADC 700, are applied to the varicap diode DI of the oscillator frequency determining network. The frequency setting voltage 302, is nominally zero volts in 1Fh and 2Fh modes and rises to about +7 volts when operation at 2.4Fh, for example SVGA, is selected.

The oscillator of VCO 300 is formed by PNP transistor Q3 which has the emitter connected to a positive supply via a resistor R7 and the collector connected to ground via a parallel combination of a resistor R8 and a capacitor C4. The base of transistor Q3 is connected to the positive supply via a resistor R6, and is coupled to ground via a capacitor C5. The oscillator frequency is determined largely by a series resonant network formed by an adjustable inductor L1 and a parallel combination of varicap diode D1 and capacitor C4. The junction of resistor R4, diode D1 cathode and capacitor C4 are coupled to the base of transistor Q3 via capacitor C6. The collector of transistor Q3 is connected via capacitor C8 to the junction of inductor L1 and a resistor, depicted in FIG. 2 as R6, which supplies the processed phase error signal 201 for oscillator synchronization. Thus, the frequency control and the phase synchronization signals are applied across the series resonant network formed by elements D1, C4, L1. Initial tuning of the oscillator may be achieved by setting the DAC voltage 302 to nominally zero volts, and with a 1Fh, NTSC horizontal sync signal coupled to the phase detector 50, inductor L1 is adjusted to center the phase detector error signal within its operating range. In an alternative oscillator setting method a non-adjustable inductor L1 is employed. A horizontal frequency sync signal of 1Fh is applied to phase detector 50 and DAC voltage 302 is varied, by the microcontroller via the bus, until the phase detector error signal is centered. The data value corresponding to this centering value of voltage 302 is then stored. To determine the frequency set voltage for operation at an exemplary 2.4Fh rate, the immediately preceding method is repeated with the data value which centered the loop being stored.

The oscillator output signal is extracted from the emitter of transistor Q3 at resistor R7 and coupled to the emitter of PNP transistor Q4 via a coupling capacitor C6. Transistor Q4 is configured as a grounded base amplifier with the base decoupled to ground by a capacitor C7 and connected to a positive supply via a resistor R11. The collector of transistor Q4 is connected to ground via resistor R10. Thus the oscillator output signal is developed across resistor R10 and coupled to the sync processing IC 400 as a line locked clock, LLC 301.

Selection between the plurality of horizontal frequencies is initiated via a control command coupled from the microcontroller 800 via bus 420 and addressed to sync processing IC 400. The control command, LFSS, starts or stops horizontal and frame generation within IC 400, thus horizontal drive output signal, 403, may be terminated as depicted by output switch 412a. Hence, in the absence of horizontal drive signal 403, horizontal scan amplifier 500 ceases to generate current flow and consequently pulse Hrt is no longer produced. Following the horizontal off command, LFSS, the microcontroller transmits control words addressed to the digital to analog converter DAC 700. A first control word addressed to DAC 700 may represent a horizontal frequency switch command which is output from DAC 700 as analog control signal 1H_SW, 701, and is coupled as has been described, to switching interlock 650. The DAC may also receive a second control word, which as has been described, generates an analog frequency setting potential FREQ. SET 302.

Having turned off horizontal drive 403, and thereby terminated generation of pulse Hrt, control signal 1H_SW is permitted to change the state of integrated circuit U1. With the inhibit removed from I.C. U1 the output signal SEL. H. FREQ. 402, is able to change state thereby selecting a different divider ratio and hence a different horizontal frequency for the phase locked loops. Hence signal 402 is applied to sync processor 400 causing divider 415A to be inserted or bypassed from the divider chain, without causing damage to the horizontal driver 450 or horizontal scan amplifier 500. The microcontroller transmits the horizontal off command prior to transmitting horizontal frequency switch command in order to ensure that horizontal scanning amplifier 500 is quiescent and thereby avoid circuitry damage. However, protection circuitry 600 provides a further level of protection by ensuring that horizontal frequency selection by signal 402 can only occur in the absence of horizontal scan pulses Hrt. Thus sync processor 400 and scanning amplifier 500 are protected against VCO divider changes resulting from spurious signals generated, for example by, ADC 700, or resulting from errant circuit functions, power supply loading or CRT arcing.

Figure 2:
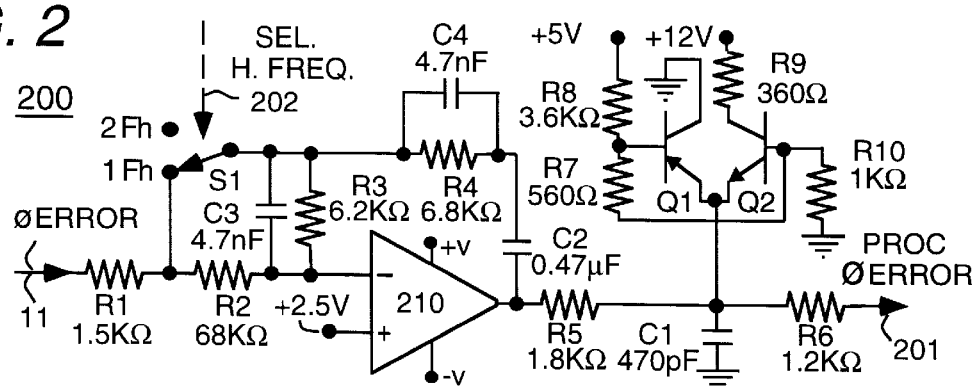
FIG. 2 is a schematic diagram of part of FIG. 1 and shows an inventive switched active filter.

The output signal from IC U1, SEL. H. FREQ., 202 is also coupled to inventive low pass active filter 200, which is shown in FIG. 2 and functions follows. A phase error signal Φ ERROR, 11, which results from the phase comparison between signal 401, divided VCO, and input signal sync 5, is coupled to input resistor R1. Input resistor R1 is connected in series with resistor R2 to a inverting input of an integrated circuit amplifier 210. The junction of resistors R1 and R2 is connected to a fixed contact 1Fh of switch S1. The moving contact of switch S1 is connected to the junction of a parallel combination of resistor R3, and capacitor C3 and a parallel combination of resistor R4, and capacitor C4. Negative feedback is applied from the output of amplifier 210 to the inverting input via a frequency dependent network formed by capacitor C2 and series connected combination of parallel networks of resistor R4 and capacitor C4 and resistor R3 and capacitor C3. Parallel network R3, C3 is connected between switch S1 wiper and the inverting input of amplifier 210. When switch S1 selects position 1Fh, resistor R2 is connected in parallel with the parallel combination of resistor R3 and capacitor C3 with the result that the newly formed parallel network, R2, R3, C3 has little effect in the determination of the amplifier gain or frequency response. Thus when synchronized at 1Fh, with switch position 1Fh selected the amplifier gain is set by input resistor R1, with the frequency response determined by capacitor C2 and parallel network R3, C3. When the display is operating at a horizontal frequency greater than 1Fh switch S1 selects position 2Fh and resistor R2 becomes the predominant gain determining component, with the frequency response controlled by the series combination of capacitor C2 and parallel networks R3, C3 and R4, C4. The non-inverting input of amplifier 210 is biased to a positive potential of about 2.5 volts.

The output from amplifier 210 is coupled via series connected resistors R5 and R6 to form a processed phase error signal, PROC. Φ ERROR, 201, for coupling to synchronize VCO 300. The junction of resistors R5 and R6 is decoupled to ground by a capacitor C1 which forms a low pass filter to prevent high frequency noise generated, for example by switched mode power supply operation from producing spurious VCO phase modulation. The junction of resistors R5 and R6 is connected to a peak to peak limiter or clipper formed by the emitters of PNP transistor Q1 and NPN transistor Q2. The collector of transistor Q1 is connected to ground with collector of transistor Q2 connected to a positive supply via a resistor R9. The base of transistor Q2 is connected to the junction of series connected resistors R10 and R7. Resistor R10 is connected to ground and resistor R7 is series connected to a further positive supply via a resistor R8. The junction resistors R7 and R8 is connected to the base of transistor Q1. Thus, resistors R7, R8 and R10 form a potential divider which determines the peak to peak clipping values of approximately +0.3 v and +2.2 volts at which processed error signal 201 is limited.

Figure 5A:
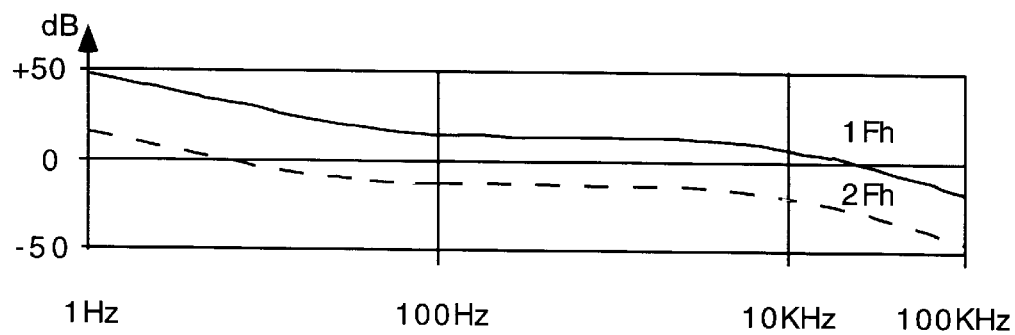
FIG. 5A is a plot illustrating the gain versus frequency characteristic of the inventive switched active filter of FIG. 2.

In a phase locked loop, the selection of phase detector output filtering is, as has been described, a compromise between static or locked phase stability and dynamic, or lock-in performance. For example, synchronization to a computer generated SVGA signal may require, or may benefit from, a narrow bandwidth VCO control signal, which will provide a highly phase stable oscillator and horizontal frequency. However, as described previously, VCR replay sync signals may include abrupt horizontal sync phase changes in the vicinity of the vertical sync and vertical blanking intervals. To prevent, or mitigate, the effect of this phase change requires that the loop have a wider bandwidth than required for either computer generated SVGA signals or broadcast signals which are not subject to abrupt phase disturbances. Advantageous amplifier 210 is arranged as an active low pass filter where output signal components are feedback to the inverting input via frequency dependent series connected network C2, C3, C4, and R3, R4. In accordance with an inventive aspect switch S1 is controlled responsive to a selected horizontal oscillator frequency such that in switch position 1Fh, resistor R2 is connected in parallel with parallel combination R3, C3 to form an impedance in series with the inverting input. This parallel combination of resistors R2, R3 and C3 produces little effect on filter gain or frequency response. In switch position 1Fh the filter gain is determined by the impedance of network C2, C1 and R4 divided by the value of input resistor R1. Clearly as the loop operating frequency approaches DC the impedance of capacitor C2 becomes large and the loop gain approaches an upper limit condition as depicted in FIG. 5A. When operating at other than 1Fh horizontal frequency switch S1 is controlled to select position 2Fh. In switch position 2Fh filter gain is determined by the impedance of feedback network R3, C2, C1 and R4, divided by the series combination of resistors R1 and R2. Since resistor R2 is significantly larger than resistor R3 the gain in the 2Fh switch position is reduced relative to that of the 1Fh position. Thus the active filter gain and bandwidth are controlled to be different in response to a selection of horizontal operating frequency.

Figure 5B:
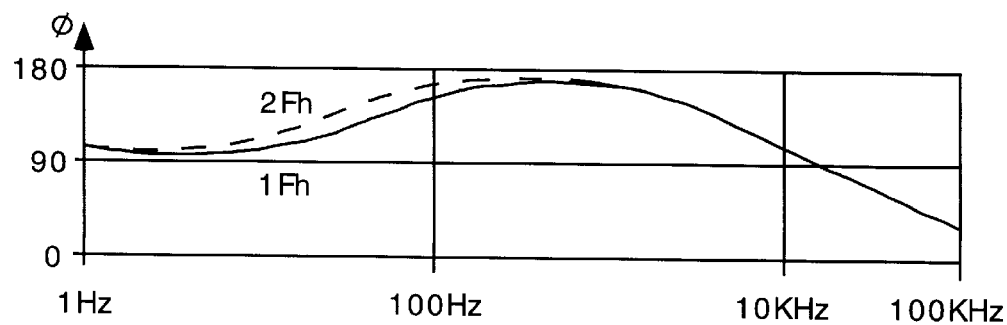
FIG. 5B is a plot illustrating the phase versus frequency characteristic of the inventive switched active filter of FIG. 2.

During operation at a horizontal frequency of 2Fh or higher, switch S1 selects the 2Fh position with the result that the gain at frequencies close to DC is approximately 10 dB, as is illustrated by the broken line in the amplitude versus frequency plot of FIG. 5A. The gain then falls to zero at about 10 Hz and continues to fall reaching −20 dB at about 100 Hz. Thus when operating in a 2Fh mode with switch S1 in the 2Fh position the zero gain bandwidth is approximately 10 Hz. FIG. 5B shows phase versus frequency plots for the two horizontal frequencies with the 2Fh mode indicated by a broken line. When operating at an NTSC frequency of 1Fh, switch S1 is controlled to select the 1Fh position which increases the filter gain and provides a zero gain bandwidth in excess of 10 kHz. Reference to FIG. 5A illustrates that greater low frequency filter gain is employed during operation at 1Fh than that used during operation at higher horizontal frequencies. In addition the filter produces a significantly wider phase error signal bandwidth than that obtained in the 2Fh mode. Active filter gain and frequency response switching is advantageously achieved with a single switch contact which provides savings in printed circuit board area which consequently reduces susceptibility stray field pickup and spurious phase instability. The inventive switching of gain and bandwidth in an active low pass filter of a phase locked loop facilitates the rapid response to abrupt horizontal phase changes at one horizontal frequency while providing enhanced phase stability and freedom from jitter at a second horizontal frequency.

What is claimed is:

1. A horizontal frequency signal generator selectably operable at a plurality of frequencies, said generator comprising:

an oscillator controlled for synchronized oscillation at a plurality of horizontal frequencies;

a source of synchronizing pulses;

a phase detector having inputs coupled to said oscillator and said source and generating an output signal representative of a phase difference between said inputs;

a processor coupled to said phase detector for processing said output signal and generating a control signal for controlling said oscillator, said processor gain being controlled responsive to selected ones of said plurality of frequencies.

2. The horizontal frequency signal generator of claim 1, wherein said gain is increased during operation of said oscillator at a lowest frequency of said plurality of frequencies.

3. The horizontal frequency signal generator of claim 1, wherein said processor has a low pass filter characteristic.

4. The horizontal frequency signal generator of claim 3, wherein said low pass filter bandwidth is controlled responsive to selected ones of said plurality of frequencies.

5. The horizontal frequency signal generator of claim 1, wherein said oscillator is selectably operable at first and second frequencies wherein said second frequency is substantially double said first frequency.

6. The horizontal frequency signal generator of claim 1, wherein said oscillator is selectably operable at integer multiple of said first frequency.

7. The horizontal frequency signal generator of claim 1, wherein said processor is an active low pass filter.

8. The horizontal frequency signal generator of claim 7, wherein said active low pass filter gain is controlled by a contact pair.

9. The horizontal frequency signal generator of claim 7, wherein said active low pass filter bandwidth changes by an order of magnitude responsive to selected ones of said plurality of frequencies.

10. A synchronizing circuit comprising:

a voltage controlled oscillator generating a horizontal frequency signal at a plurality of frequencies;

a source of horizontal synchronizing pulses;

means for synchronizing said voltage controlled oscillator and said horizontal synchronizing pulses; and, an active low pass filter coupled to said synchronizing means for filtering a voltage from said synchronizing means for coupling to synchronize said voltage controlled oscillator, wherein said active filter bandwidth is changed responsive to operation at one of said plurality of frequencies.

11. The synchronizing circuit of claim 10, wherein said active low pass filter gain is changed responsive to a digital to analog converted signal.

12. The synchronizing circuit of claim 10, wherein said active low pass filter is controlled responsive to a data bus signal.

13. The synchronizing circuit of claim 10, wherein a voltage gain of said active low pass filter is increased during operation at a lowest frequency of said plurality frequencies.

14. A video display operable at a plurality of horizontal frequencies comprising:

a voltage controlled oscillator operable at a plurality of frequencies;

a source of synchronizing pulses;

a phase detector coupled to said oscillator and said source for generating an output signal representative of a phase difference between said inputs; and, an active filter coupled to said output signal for filtering said output signal and generating a voltage for controlling said oscillator, wherein said active filter is controlled to a first gain value at a first frequency of said plurality of frequencies, and said active filter is controlled to a second gain value at a second frequency of said plurality of frequencies.

15. The video display of claim 14, wherein said active filter having selectable values of gain has a low pass frequency characteristic.

16. The video display of claim 14, wherein said first frequency of said plurality of frequencies represents a lowest frequency of said plurality of frequencies.

17. The video display of claim 14, wherein said active filter gain is increased when said oscillator operates at said first frequency of said plurality of frequencies.

18. The video display of claim 14, wherein said active filter gain is decreased when said oscillator operates at said second frequency of said plurality of frequencies.

19. The video display of claim 18, wherein said second frequency of said plurality of frequencies is nominally double said first frequency.

20. The video display of claim 18, wherein said second frequency of said plurality of frequencies is greater than double said first frequency.

* * * * *